(12) United States Patent
Armenta Lopez et al.

(10) Patent No.: US 10,915,573 B2
(45) Date of Patent: Feb. 9, 2021

(54) CHARACTERIZING ELECTRONIC DESIGNS VIA VISUAL PROCESSING AND DATA TRANSFORMATION

(71) Applicant: International Business Machines Corporation, Armonk, NY (US)

(72) Inventors: Addis Armenta Lopez, Tlajomulco de Zuñiga (MX); Jesus Gabriel Trillo Vargas, Guadalajara (MX); Jose de Jesus Jimenez Gonzalez, Guadalajara (MX); Alejandro M. Lopez, Tlaquepaque (MX); Adolfo Mendez Morales, Guadalajara (MX)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 16/129,855

(22) Filed: Sep. 13, 2018

(65) Prior Publication Data
US 2020/0089787 A1    Mar. 19, 2020

(51) Int. Cl.
| | | |
|---|---|---|
| G06F 30/30 | (2020.01) | |
| G06F 30/323 | (2020.01) | |
| G06F 30/33 | (2020.01) | |
| G06F 30/3323 | (2020.01) | |
| G06F 16/583 | (2019.01) | |

(Continued)

(52) U.S. Cl.
CPC .......... *G06F 16/5854* (2019.01); *G06F 16/56* (2019.01); *G06F 16/5838* (2019.01); *G06F 17/11* (2013.01); *G06F 30/30* (2020.01); *G06F 30/323* (2020.01); *G06F 30/33* (2020.01); *G06F 30/3323* (2020.01)

(58) Field of Classification Search
CPC .. G06F 16/56; G06F 16/5838; G06F 16/5854; G06F 17/11; G06F 17/30256; G06F 17/30259; G06F 17/30271; G06F 17/5045; G06F 30/30; G06F 30/323; G06F 30/33; G06F 30/3323
See application file for complete search history.

(56) References Cited

U.S. PATENT DOCUMENTS 5,815,402 A * 9/1998 Taylor ..................... G06F 30/33
716/103
6,668,362 B1 * 12/2003 McIlwain ........... G06F 30/3323
716/107

(Continued)

OTHER PUBLICATIONS

Johnson ("Recognising electronic symbols using neural networks," IEE Colloquium on Document Image Processing and Multimedia, Mar. 5-25, 1999) (Year: 1999).*

(Continued)

*Primary Examiner* — Yubin Hung
(74) *Attorney, Agent, or Firm* — Edward J. Wixted, III

(57) ABSTRACT

A cognitive, artificially intelligent system employs, in part, visual recognition and image processing to transform electronic design information, such as a schematic diagram, into a machine-readable data structure suitable for machine-based comparison of one data structure against another data structure of like kind. A comparison method identifies and quantifies similarities or equivalencies between the any such data structures, and hence between respectively corresponding electronic designs.

18 Claims, 8 Drawing Sheets

(51) Int. Cl.
*G06F 17/11* (2006.01)
*G06F 16/56* (2019.01)

(56) References Cited

U.S. PATENT DOCUMENTS

| | | | | |
|---|---|---|---|---|
| 7,373,618 | B1 * | 5/2008 | Khoo | G06F 30/3323 716/103 |
| 7,669,158 | B2 * | 2/2010 | Kamat | G06F 30/39 716/118 |
| 8,065,654 | B2 | 11/2011 | Shiihara | |
| 8,181,137 | B2 | 5/2012 | Uppaluri | |
| 8,181,146 | B1 * | 5/2012 | Low | G06F 30/3323 716/136 |
| 8,255,846 | B2 | 8/2012 | Binder | |
| 8,543,372 | B1 * | 9/2013 | Fernandez | G06Q 50/184 703/26 |
| 8,789,005 | B1 * | 7/2014 | Umino | G06F 30/39 716/135 |
| 8,813,004 | B1 * | 8/2014 | O'Riordan | G06F 30/367 716/102 |
| 8,830,266 | B1 | 9/2014 | Aberg | |
| 8,863,052 | B1 * | 10/2014 | Dhuria | G06F 30/367 716/108 |
| 2004/0025123 | A1 * | 2/2004 | Angilivelil | G01R 31/3016 700/109 |
| 2004/0199880 | A1 * | 10/2004 | Kresh | G06F 30/30 716/106 |
| 2006/0045325 | A1 * | 3/2006 | Zavadsky | G01R 31/31704 382/145 |
| 2007/0011632 | A1 | 1/2007 | Yang | |
| 2009/0013289 | A1 * | 1/2009 | Arbel | G06F 30/327 716/134 |
| 2012/0227024 | A1 | 9/2012 | Uppaluri | |
| 2013/0091481 | A1 * | 4/2013 | Su | G06F 30/39 716/122 |
| 2019/0065660 | A1 * | 2/2019 | Chuang | G06F 16/9024 |

OTHER PUBLICATIONS

Filipski et al. ("Automated conversion of engineering drawings to CAD form," Proceedings of the IEEE, vol. 8, Iss. 7, Jul. 1992) (Year: 1992).*

"Searching schematic diagrams based on data coming from a particular data source—Help", 2 pages, Sep. 7, 2018, <http://desktop.arcgis.com/en/arcmap/latest/extensions/schematics/searching-diagrams-based-on-data-coming-from-a-particular-data-source.htm>.

* cited by examiner

Fig. 5

500A:
- N1 = LDR1(N2) + R2(N4) + IC1(N2N3N6N7) + D1(N9) + RLY1(N9) + 12V-IN  501
- N2 = LDR1(N1) + R1(N3) + IC1(N1N3N6N7)  502
- N3 = R1(N2) + R3(N5) + IC1(N1N2N6N7) + R5(N8) + C1(N8) + Q1(N8N9) + GND  503
- N4 = R2(N1) + P1(N5N6)  504
- N5 = R3(N3) + P1(N4N6)  505
- N6 = P1(N4N5) + IC1(N1N2N3N7)  506
- N7 = R4(N8) + IC1(N1N2N3N6)  507
- N8 = R4(N7) + R5(N3) + C1(N3) + Q1(N3N9)  508
- N9 = Q1(N3N8) + D1(N1) + RLY1(N1)  509

500B:
- N1 = R5(N2) + R1(N3) + C1(N8) + R4(N8) + Q1(N9N8) + IC1(N2N5N6N7) + GND  510
- N2 = R5(N1) + IC1(N1N5N6N7) + LDR1(N5)  511
- N3 = R1(N1) + P1(N4N6)  512
- N4 = P1(N3N6) + R2(N5)  513
- N5 = LDR1(N2) + IC1(N1N2N6N7) + RLY1(N9) + D1(N9) + R2(N4) + 12V IN  514
- N6 = P1(N3N4) + IC1(N1N2N5N7)  515
- N7 = IC1(N1N2N5N6) + R3(N8)  516
- N8 = R3(N7) + R4(N1) + C1(N1) + Q1(N9N1)  517
- N9 = RLY1(N5) + D1(N5) + Q1(N1N8)  518

```
<design>
  <designName>400A</designName>
  <node>        602
    <nodeName>N1</nodeName>
    <component>
      <componentName>LDR1</componentName>
      <connectedToNode>N2</connectedToNode>       603
    </component>
    <component>
      <componentName>R2</componentName>
      <connectedToNode>N4</connectedToNode>
    </component>
    <component>
      <componentName>IC1</componentName>
      <connectedToNode>N2</connectedToNode>
      <connectedToNode>N3</connectedToNode>       604
      <connectedToNode>N6</connectedToNode>
      <connectedToNode>N7</connectedToNode>
    </component>
    .
    .
    <component>
      <componentName>D1</componentName>
      <connectedToNode>N9</connectedToNode>
    </component>
    <component>
      <componentName>RLY1</componentName>
      <connectedToNode>N9</connectedToNode>
    </component>
    <component>
      <componentName>12V-IN</componentName>
    </component>
  </node>        605
  .
  .
</design>
```

| NFE 501<br>NODE N1, 400A<br>701A | NFE 510<br>NODE N1, 400B<br>701B | Similarity score<br>(scale 0-1), 701C |
|---|---|---|
| Light dependent resistor (LDR1) | - | 0.00 |
| Fixed resistor (qty 1, R2) | Fixed resistor (qty 3, R1, R4) | 0.33 |
| Integrated circuit (IC1) | Integrated circuit (IC1) | 1.00 |
| Diode (D1) | - | 0.00 |
| Relay (RLY1) | - | 0.00 |
| Power (12V-IN) | - | 0.00 |
| NFE 501 to NFE 510 similarity score (average) | | 0.22 |

FIG. 7B

| NFE 501<br>NODE N1, 400A<br>702A | NFE 511<br>NODE N2, 400B<br>702B | Similarity score<br>(scale 0-1), 702C |
|---|---|---|
| Light dependent resistor (LDR1) | Light dependent resistor (LDR1) | 1.00 |
| Fixed resistor (qty 1, R2) | Fixed resistor (qty 1, R5) | 1.00 |
| Integrated circuit (IC1) | Integrated circuit (IC1) | 1.00 |
| Diode (D1) | - | 0.00 |
| Relay (RLY1) | - | 0.00 |
| Power (12V-IN) | - | 0.00 |
| NFE 501 to NFE 511 similarity score (average) | | 0.50 |

| NFE 501<br>NODE N1, 400A<br>705A | NFE 514<br>NODE N5, 400B<br>705B | Similarity score<br>(scale 0-1), 705C |
|---|---|---|
| Light dependent resistor (LDR1) | Light dependent resistor (LDR1) | 1.00 |
| Fixed resistor (qty 1, R2) | Fixed resistor (qty 1, R2) | 1.00 |
| Integrated circuit (IC1) | Integrated circuit (IC1) | 1.00 |
| Diode (D1) | Diode (D1) | 1.00 |
| Relay (RLY1) | Relay (RLY1) | 1.00 |
| Power (12V-IN) | Power (12V-IN) | 1.00 |
| NFE 501 to NFE 514 similarity score (average) | | 1.00 |

FIG. 7C

CHARACTERIZING ELECTRONIC DESIGNS VIA VISUAL PROCESSING AND DATA TRANSFORMATION

BACKGROUND

The present invention relates generally to the field of cognitive visual processing, and more particularly to cognitive visual processing as applied with respect to electronic design characterization.

Businesses and enterprises that develop electronic circuits and devices have strong incentives to avoid inadvertently duplicating existing products or infringing existing intellectual property rights. When the business develops a new circuit or device design, it is in the interest of the business to compare their new design with existing designs to determine the degree of similarity that may exist between the new design and the existing designs. Conversely, businesses also have an interest in discovering products in the marketplace that may infringe on intellectual property owned by the business.

SUMMARY

According to an aspect of the present invention, there is a method, computer program product and/or system that performs the following operations (not necessarily in the following order): (i) receiving design information for a first device; (ii) receiving design information for a second device; (iii) generating a first data structure based on the design information for the first device, wherein the first data structure includes a first element pertaining to a first component of the first device; (iv) generating a second data structure based on the design information for the second device, wherein the second data structure includes a second element pertaining to a second component of the second device; (v) comparing the first element against the second element to generate a comparison dataset; and (vi) sending the comparison dataset to a storage address. At least the generating a comparison dataset operation is performed by computer software running on computer hardware.

BRIEF DESCRIPTION OF THE DRAWINGS

FIG. 5 is a table showing information that is generated in accordance with at least one embodiment of the present invention;

FIG. 6 is a data structure showing information that is generated in accordance with at least one embodiment of the present invention;

FIG. 7A is a table showing information that is generated in accordance with at least one embodiment of the present invention;

FIG. 7B is a table showing information that is generated in accordance with at least one embodiment of the present invention;

FIG. 7C is a table showing information that is generated in accordance with at least one embodiment of the present invention.

DETAILED DESCRIPTION

Figure 1:
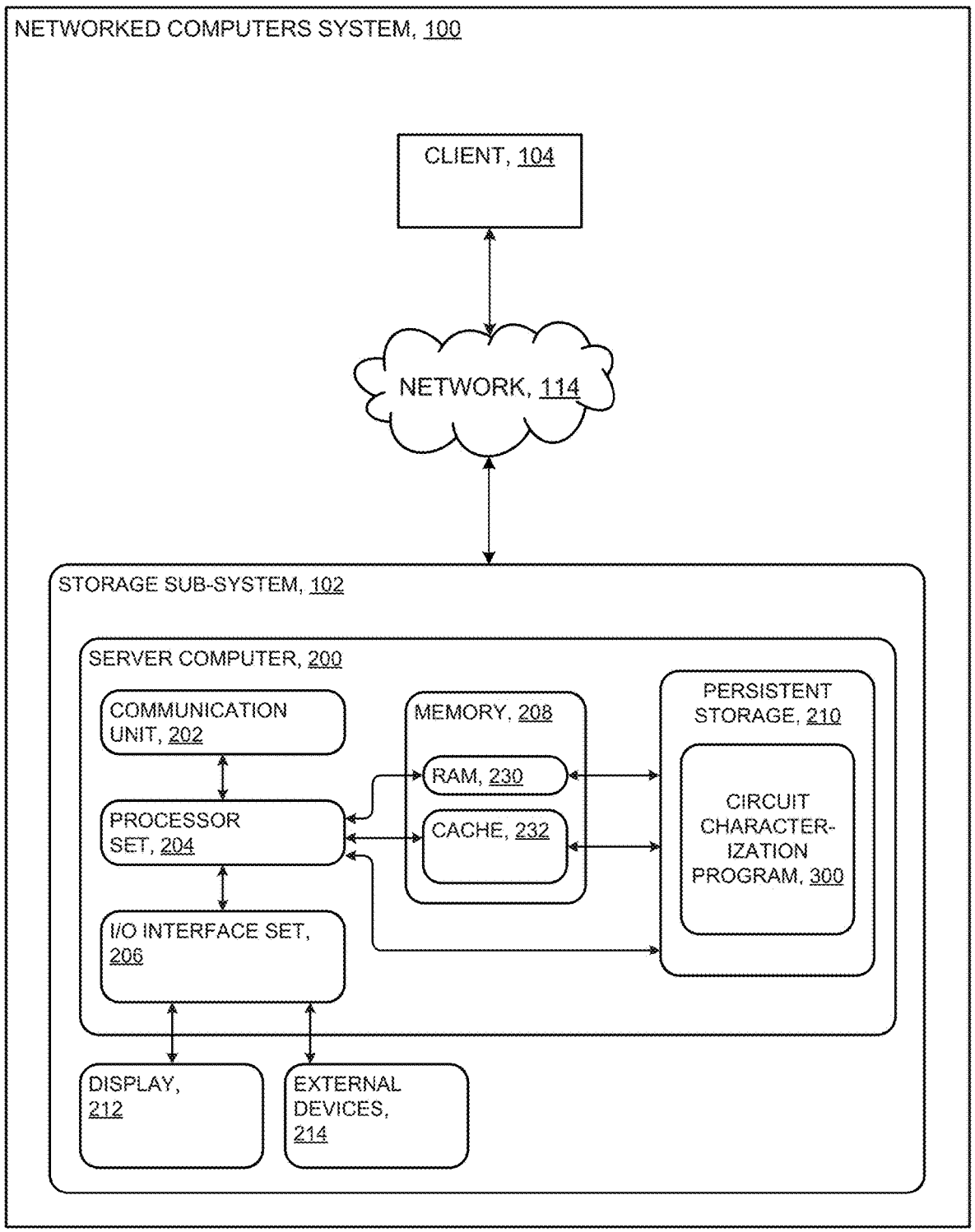
FIG. 1 is a block diagram of a computing environment in accordance with at least one embodiment of the present invention.

Embodiments of the present invention comprise at least two phases—an abstraction phase, and a comparison phase. The abstraction phase provides an approach for characterizing an electronic design into an abstract representation, such as a data structure. The comparison phase determines a degree of similarity between any two of the data structures, and hence the electronic designs represented by the data structures. The system ingests design information, such as (but not limited to) a schematic diagram representing an electronic device, circuit, system, or other design. From the design information, the system extracts (through visual recognition techniques, for example) the set of components making up the design and respective interconnections (and/or interrelationships) between and among the components. Embodiments of the present invention encode the extracted information into a compact notation (a data structure) which lends itself to comparison of one design against another. The comparison process quantifies a degree of similarity in physical design characteristics between the abstract data structures, based on the corresponding electronic designs.

This Detailed Description section is divided into the following sub-sections: (i) The Hardware and Software Environment; (ii) Example Embodiment; (iii) Further Comments and/or Embodiments; and (iv) Definitions.

I. The Hardware and Software Environment

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

An embodiment of a possible hardware and software environment for software and/or methods according to the present invention will now be described in detail with reference to the Figures. FIG. 1 is a functional block diagram illustrating various portions of networked computers system 100, including storage sub-system 102; client sub-system 104; communication network 114; server computer 200; communications unit 202; processor set 204; input/output (I/O) interface set 206; memory device 208; persistent storage device 210; display device 212; external device set 214; random access memory (RAM) devices 230; cache memory device 232; and circuit characterization program 300.

Storage sub-system 102 is, in many respects, representative of the various computer sub-system(s) in the present invention. Accordingly, several portions of storage sub-system 102 will now be discussed in the following paragraphs.

Storage sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. Circuit characterization program 300 is a collection of machine readable instructions and/or data that is used to create, manage and control certain software functions that will be discussed in detail, below, in the Example Embodiment sub-section of this Detailed Description section.

Storage sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

Storage sub-system 102 is shown as a block diagram with many double arrows. These double arrows (no separate reference numerals) represent a communications fabric, which provides communications between various components of storage sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for storage sub-system 102; and/or (ii) devices external to storage sub-system 102 may be able to provide memory for storage sub-system 102.

Circuit characterization program 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Circuit characterization program 300 may include both machine readable and performable instructions and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202, in these examples, provides for communications with other data processing systems or devices external to storage sub-system 102. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external devices 214. External devices 214 will typically include devices such as a keyboard, keypad, a touch screen, and/or some other suitable input device. External devices 214 can also include portable computer-readable storage media such as, for example, thumb drives, portable optical or magnetic disks, and memory cards. Software and data used to practice embodiments of the present invention, for example, circuit characterization program 300, can be stored on such portable computer-readable storage media. In these embodiments, the relevant software may (or may not) be loaded, in whole or in part, onto persistent storage 210 via I/O interface set 206. I/O interface set 206 also connects in data communication with display 212.

Display 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature, herein, is used merely for convenience, and, thus, the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

II. Example Embodiment

Figure 2:
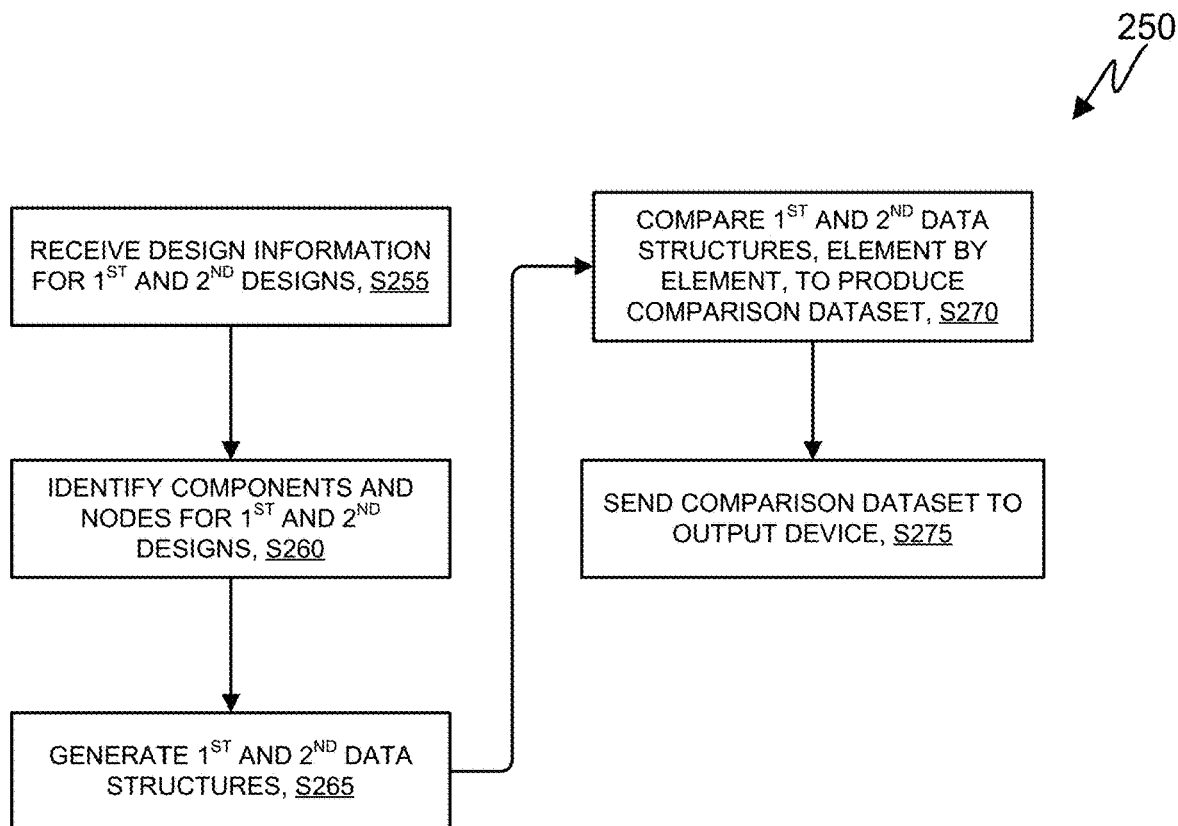
FIG. 2 is a flowchart showing a method performed in accordance with at least one embodiment of the present invention.
Figure 3:
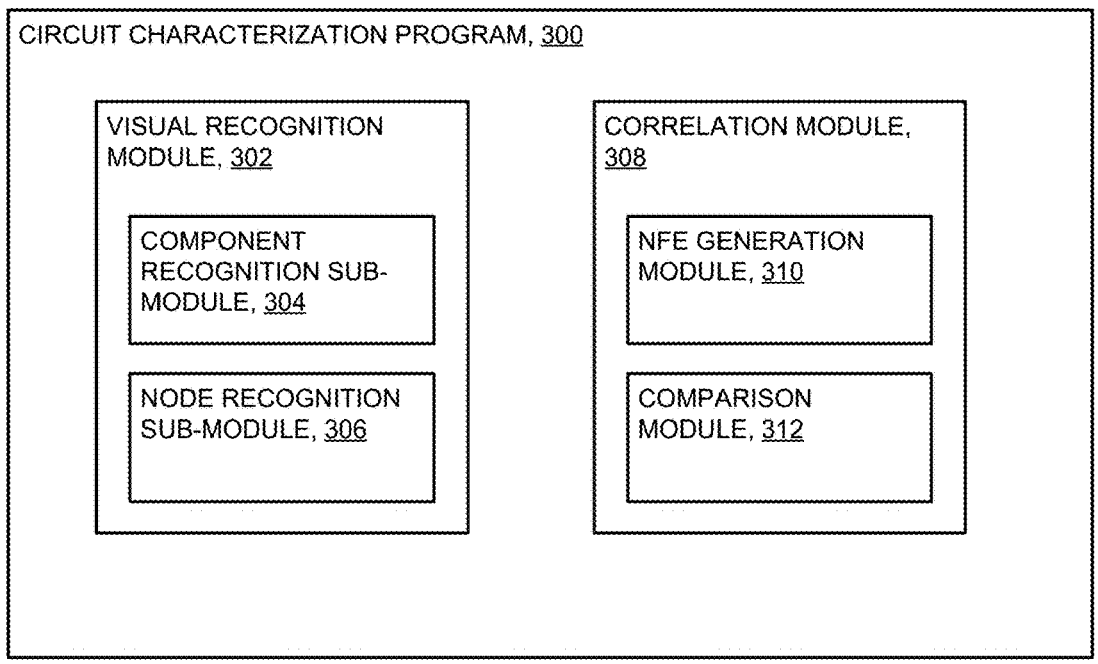
FIG. 3 is a block diagram showing a machine logic (for example, software) portion of a system in accordance with at least one embodiment of the present invention.

FIG. 2 shows flowchart 250 depicting a method according to the present invention. FIG. 3 shows circuit characterization program 300 for performing at least some of the method operations of flowchart 250. This method and associated software will now be discussed, over the course of the following paragraphs, with extensive reference to FIG. 2 (for the method operation blocks) and FIG. 3 (for the software blocks).

Processing begins at operation S255, where component recognition sub-module 304 of visual recognition module 302 of circuit characterization program 300 receives $1^{st}$ and $2^{nd}$ design information, respectively, pertaining to a $1^{st\ and\ a}$ $2^{nd}$ electronic design or device. While this particular embodiment involves only two designs, some embodiments may involve comparisons among any number of designs, such as comparisons of one to many, or many to many.

Processing proceeds at operation S260, where component recognition sub-module 304, and node recognition sub-module, 306, both of visual recognition module 302, working in conjunction with one another, identify all, (or a threshold proportion thereof, such as 90% or more) components and nodes represented in each of the given $1^{st}$ and $2^{nd}$ design information.

In some embodiments, visual recognition module 302 is a cognitive system that is capable of learning and recognizing standard symbology with respect to electronic schematic drawing standards and practices. Over time, the system refines and expands its corpus of electronic design knowledge (knowledge base), including drafting standards, through training processes and/or user interaction. In some embodiments, visual recognition module 302 is a neural network.

As drafting and symbology standards are revised and updated, the system ingests the new information into its corpus of knowledge. In some embodiments, the system is given access to standards organizations' websites from which the system can download standards revisions and/or newly released standards. In other embodiments, the system periodically conducts internet searches for new information. The system compares any new information encountered in such searches, such as a new component symbol, against its knowledge base and incorporates new information therein. In some embodiments, the system sends, for display to a user, a new symbol along with information justifying why the symbol is considered as "new". The system then receives user input in response, indicating for example whether to incorporate the "new" symbol in the knowledge base, what type of component the symbol represents, and/or how to classify the symbol in the knowledge base.

In some embodiments, each of the $1^{st}$ and $2^{nd}$ design information comprises a schematic diagram of the respective design, and/or other design information, as discussed below in the Further Comments and/or Embodiments sub-section of this Detailed Description section.

Processing proceeds at operation S265, where NFE generation module 310, of correlation module 308, of circuit characterization program 300, generates respective $1^{st}$ and $2^{nd}$ data structures based on: (i) the $1^{st}$ and $2^{nd}$ design information received in operation S255 above; and/or (ii) the components and nodes identified in operation S260 above. In some embodiments, the $2^{nd}$ design information has previously been processed into a corresponding $2^{nd}$ data structure, which is recalled from a schematic archive database for this comparison with the $1^{st}$ data structure.

In some embodiments, the $1^{st}$ and $2^{nd}$ data structures comprise respective $1^{st}$ and $2^{nd}$ node equations lists (NELs). Each NEL contains a set of node functions equations (NFEs). Each NFE contains information descriptive of one node of the subject design. Together, a complete set of NFEs, making up an NEL describes the respective design in a machine-readable form and format. Discussion of the makeup of an NEL and NFEs is given below in the Further Comments and/or Embodiments sub-section of this Detailed Description section.

Processing proceeds at operation S270, where comparison module 312 steps through each NFE of the $1^{st}$ NEL. For each NFE, comparison module 312 compares the elements of the NFE with elements of each NFE of the $2^{nd}$ NEL. In some embodiments, each NFE to NFE comparison yields an individual similarity score. Once every NFE of the $1^{st}$ NEL has been compared with every NFE of the $2^{nd}$ NEL, comparison module 312 combines the individual similarity scores to generate an overall similarity score. Comparison module 312 generates a comparison dataset (based at least in part on the overall similarity score) indicative of a degree of similarity that exists between the $1^{st}$ and $2^{nd}$ designs.

Processing proceeds at operation S275, where comparison module 312 sends results of the comparison process (the comparison dataset) to an output device, such as an output data bus, a user interface for display, or to any volatile or non-volatile storage device.

III. Further Comments and/or Embodiments

Some embodiments of the present invention may include one or more of the following features, characteristics, and/or advantages: (i) validates two or more electronic diagrams functionality by analyzing and comparing similarities embodied in respective schematics; (ii) uses visual recognition and cognitive technologies to convert a schematic image (and/or other design-related information) into machine readable form and format (for example, a node equations list (NEL) comprising one or more node function equations (NFEs)); (iii) creates a repository (in some embodiments, a cloud-based repository, for example a schematics archive database (SADB)) of NELs where each NEL represents information obtained in item (ii) above; (iv) abstracts information describing a circuit or device design into a set of node function equations; (v) provides a comparison algorithm for comparing two NELs to determine a degree of similarity between them; and/or (vi) when provided with bill of material information and associated procurement/production data for an electronic circuit or design, provides a corresponding cost approximation for the circuit or design.

Some embodiments of the present invention may include one or more of the following features, characteristics, and/or advantages: (i) reduces human mistakes with respect to comparing electronic designs; (ii) reduces time spent performing visual analysis; (iii) compares a number of diagrams far in excess of what can be done manually; (iv) generates a node equations list (an NEL, comprising a set of node function equations (NFEs)) for an electronic design; (v) compares an NEL for a subject design against many NELs representing other designs to identify similarities between the subject design and the others, based on a configurable range of search refinement (sometimes herein referred to as a "similarity threshold"); and/or (vi) generates and/or acquires NELs corresponding to a potentially vast number of designs, and stores the NELs in a database for future reference, comparisons, and/or analysis.

Some embodiments of the present invention comprise a visual recognition system (for example, a neural network or other image processing system). The visual recognition service is an artificial intelligence type of system trained to detect and recognize the symbols that are used in electronic schematics drawn in accordance with electrical drafting standards, such as those issued by electrical standards organizations. In some embodiments, when the visual recognition service encounters an unknown (to the visual recognition service) drafting symbol or artefact, it interacts with a user or other reference materials to incorporate the symbol or artefact into its artificial intelligence system, thus acquiring new knowledge and expanding its knowledge base over time.

The visual recognition system, working in conjunction with the artificial intelligence system, form a node function equation (NFE) when they detect that a given object is an electronic component and that the component is connected to one or more other component(s). Such a connection is called a node. The system analyzes a subject design and generates a set of NFEs, based on the principle that a node is a junction where two or more components (or stated more precisely, two or more component terminals) are connected together or communicatively coupled in any way. The system proceeds to detect and characterize each node in the form of an NFE. Once all nodes in the design have been detected and characterized, the resultant set of NFEs is grouped together in a data structure called a node equations list (NEL).

Some embodiments of the present invention may include one or more of the following features, characteristics, and/or advantages: (i) given a subject NEL comprising a set of NFEs associated with a subject design, and a plurality of NEL respectively associated with a plurality of existing designs, determines a similarity score between the subject NEL and each NEL of the plurality of existing NELs, to identify existing design(s) that are similar to the subject design; (ii) saves time and/or cost associated with comparing electronic designs against one another; (iii) reduces comparison mistakes; (iv) creates a continuously growing database with re-usable data; (v) provides a user-customizable search and display system; (vi) has uses in wide variety of applications, including electric/electronic/information technology/business sector for research and development (R&D) and manufacturing centers, to name just a few examples.

Some embodiments of the present invention may include one or more of the following features, characteristics, and/or advantages: (i) automatically performs a comparison between two electronic designs based on respective schematics and/or other design information; (ii) converts elements of a schematic (or other design information) into a compact notational representation that is machine-readable and lends itself to automated comparisons between designs; (iii) performs comparisons between designs, in terms of the components, and interconnections among and between them; (iv) computes a level of similarity between any two designs being compared; (v) takes into account all available sources (with respect to existing designs); (vi) accumulates a database that helps to find existing solutions for specific problems; (vii) given an image file, representing an electronic design (for example, a schematic diagram), obtains the main features and elements (for example, schematic characteristics and/or node equations list) of the electronic design; (viii) stores the obtained information (for example, a node equations list) in a database ("schematics archive database" (SADB)); and/or (ix) compares the obtained information (corresponding to a new node equations list) with the stored information (existing node equations lists in a schematics archive database).

Further, with respect to item (ii) in the paragraph above, in some embodiments of the present invention, the compact notational representation of a schematic comprises a data structure containing a series of node function equations. A node function equation represents all components connected in common at each node in a design.

Figures 4A, 4B:
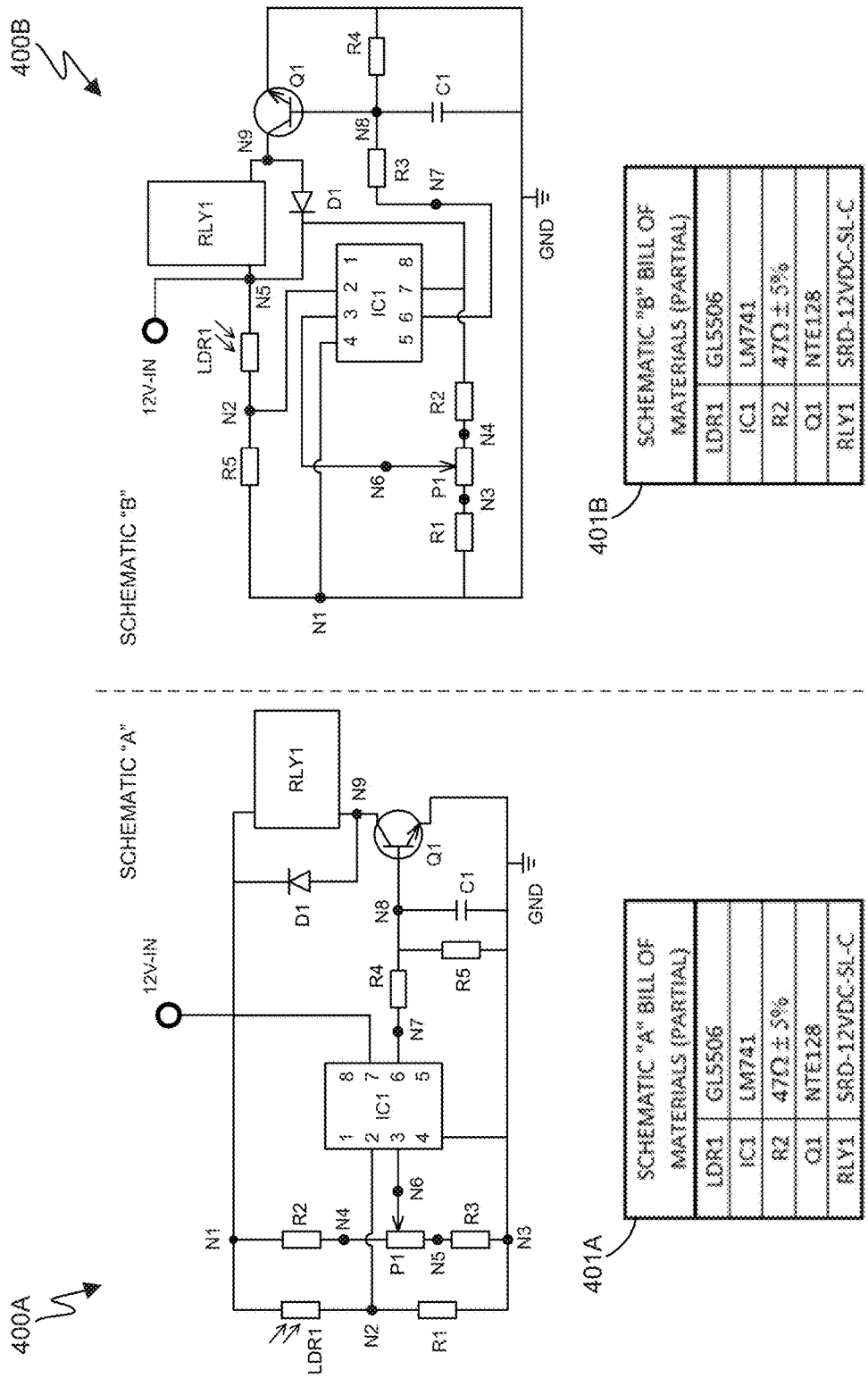
FIG. 4A is a schematic diagram of an electronic circuit, in accordance with at least one embodiment of the present invention.
FIG. 4B is a schematic diagram of an electronic circuit, in accordance with at least one embodiment of the present invention.

Schematics 400A and 400B, respectively of FIGS. 4A and 4B, represent respective circuit designs. While schematics 400A and 400B are laid out differently and use (in some cases) different nomenclature for the components and nodes, careful analysis reveals the designs to be the same (100% similarity), from a schematic perspective. A process by which some embodiments arrive at a similarity determination will be discussed below, with reference to FIGS. 4A, 4B, and 5.

Node equations lists 500A and 500B of FIG. 5 respectively correspond to schematics 400A and 400B. Schematic "A" bill of materials 401A (of FIG. 4A) is a partial parts list that corresponds to schematic 400A, and lists some of the components of schematic 400A, namely LDR1, IC1, R2, Q1, and RLY1. Schematic "B" bill of materials 401B (of FIG. 4B) is a partial parts list that corresponds to schematic 400B, and lists some of the components of schematic 400B, namely LDR1, IC1, R2, Q1, and RLY1. In some embodiments, both bills of material (401A and 401B) include all components of the corresponding schematic. In the present example, it so happens that the part numbers for the listed components are the same between schematics 400A and 400B. That is, for example, the part number for LDR1 in schematic 400A (as listed in bill of materials 401A) is the same part number (GL5506) as for LDR1 in schematic 400B. Similarly, the other part numbers as listed in the bills of materials (401A and 401B) are respectively the same. This part number commonality (irrespective of the component identifiers, e.g., LDR1), or lack thereof in other instances, may influence the outcome of the comparison process in some embodiments. However, the commonality between schematics "A" and "B" (400A and 400B) with respect to the component identifiers (e.g., LDR1, IC1, etc.) is merely happenstance. In some embodiments, these identifiers are included in the schematics as provided to the visual recognition system, and in other embodiments, the visual recognition system assigns the identifiers independently from design to design. The identifiers in the embodiment of schematics 400A and 400B have no effect on the outcome of the comparison processes.

In some embodiments of the present invention, component recognition sub-module 304 of visual recognition module 302 identifies constituent components of schematics 400A and 400B. Referring to schematic 400A, for example, component recognition sub-module 304 identifies LDR1, R1-R5, P1, D1, C1, Q1, IC1, RLY1, 12V-IN, and GND as components making up the design. Component recognition sub-module 304 arbitrarily assigns the component designators (LDR1, Rn, C1, etc.) independently for each diagram. Alternatively, if component identifiers are provided on the schematics, component recognition sub-module 304 may recognize the identifiers and associate them with the respective nodes.

In some embodiments, component recognition sub-module 304 identifies the values of the components, and/or their respective part numbers (PNs) through nomenclature markings on the schematics, by reference to associated parts lists, catalog information, and/or through additional design information, independent of the schematic diagrams, that may be provided. For the purpose of the present discussion, the values and PNs of these components are not material with respect to generating a comparison result, while in some embodiments, they are.

Node recognition sub-module 306, of visual recognition module 302, identifies nodes N1 through N9 on schematics 400A and 400B. Node recognition sub-module 306 arbitrarily assigns the designators N1, N2, etc. independently for each schematic diagram. Alternatively, if node identifiers are provided on the schematic diagrams, node recognition sub-module 306 may recognize the identifiers and associate them with the respective nodes.

Some embodiments of the present invention transform a schematic representation of a circuit design into a node function equation (NFE). Some embodiments receive additional input, in addition to a schematic, or instead of a schematic. Examples of such additional input may include manufacturing data, such as: (i) "open American Standard Code for Information Interchange (ASCII) vector format for 2D binary image" files, for describing the design of the printed circuit board (PCB); (ii) component placement data and/or files describing the placement of components on the PCB; (iii) drill data; (iv) mask data, such as PCB exposure masks; (v) test data (in-circuit, functional, point-to-point, etc.); (vi) netlist (describing individual circuits within the design); and/or (vii) any design or manufacturing data which, separately, or in combination, provides sufficient information to perform operations in accordance with the present invention.

NFE generation module 310, of correlation module 308, formulates a node function equation NFE for a given node, expressed as a sum of products, using the following transformation formula:

$$N_{f(N)} = C_{x1}(N_{y1}) + C_{x2}(N_{y2}) + \ldots + C_{xn}(N_{yn}) \quad [1]$$

Where:

$N_{f(N)}$ represents a given node;

$C_{xn}$ represents a component connected to the given node; and $N_{yn}$ represents another node connected to component $C_{xn}$ Component recognition sub-module 304 analyzes schematic 400A to determine that LDR1 is a light dependent resistor. In some embodiments, it makes this recognition based on either (or a combination of): (i) the label text "LDRn"; (ii) image processing that matches up the graphic symbol with a stored library of standard electrical/electronic drafting symbols; (iii) schematic "A" bill of materials 401A; and/or (iv) other available design information. In similar fashion, component recognition sub-module 304 determines the types of the other components (resistors, potentiometer, capacitor, transistor, diode, etc.) included in schematic 400A. Node recognition sub-module 306 determines connection patterns (signal paths) among and between the components.

Once component recognition sub-module 304 and node recognition sub-module 306 have identified components, connection patterns, and nodes comprising schematics 400A and 400B, NFE generation module 310 generates a set of node function equations based on transformation formula [1] above. For example, node recognition sub-module 306 determines that the following components/terminals are electrically connected in common at node N1 of schematic 400A: a first terminal of light dependent resistor LDR1; a first terminal of resistor R2; pin 7 of IC1; the cathode of diode D1; the "positive" coil terminal of relay RLY1; and a DC input voltage terminal 12V-IN. Based on this information, NFE generation module 310 applies transformation formula [1] above, to transform the component and node information, with respect to node N1 of schematic 400A, into node function equation NFE 501.

NFE generation module 310 proceeds, in like fashion, to process the remaining nodes (N2-N9 of schematic 400A, and N1-N9 of schematic 400B). NFE generation module 310 generates two structured data constructs, comprising the two sets of node function equations as follows: (i) NEL 500A (node equations list pertaining to schematic 400A) comprising NFEs 501-509; and (ii) NEL 500B (node equations list pertaining to schematic 400B) comprising NFEs 510-518. Thus, embodiments of the present invention transform unstructured data (e.g. a schematic diagram, a parts list, a library of standard drafting symbols, other design data, etc.) into a data construct (e.g. a text-based node equations list comprising a set of node function equations) of a defined format and syntax.

Another example of a structured data construct (besides NELs 500A and 500B of FIG. 5), in accordance with some embodiments, is an extended markup language (XML) file. XML file 600, of FIG. 6, shows an XML expression (a data construct) equivalent to part of NEL 500A, and more particularly to NFE 501 thereof. Line 601 identifies the XML file as pertaining to schematic 400A. Line 602 starts a code section pertaining to node N1, which terminates at line 605. The code (including all code from line 602 to 605, inclusive) is analogous to NFE 501 of FIG. 5 (i.e., they both represent the set of components connected to node N1 of schematic 400A).

Code section 603 pertains to component LDR1, showing that in addition to one terminal of LDR1 being connected to node N1 (by virtue of being within the node N1 code section extending from line 602 to line 605), the other terminal of LDR1 is connected to node N2. This relationship corresponds to schematic 400A where the two terminals of LDR1 are seen, respectively, connected to nodes N1 and N2.

Code section 604 pertains to component IC1, showing that in addition to one terminal being connected to node N1 (by virtue of being within the node N1 code section), other terminals of IC1 are connected to nodes N2, N3, N6, and N7. This relationship corresponds to schematic 400A where various terminals (pins 7, 2, 4, 3, and 6) of IC1 are connected to nodes N1, N2, N3, N6, and N7, respectively.

The remaining component code sections (between successive pairs of <component> </component> tags, inclusive) step through all remaining components connected to node N1 (i.e., R2, D1, RLY1, and 12V-IN). Each component code section, in turn, lists other nodes (besides node N1) that the associated component is connect to.

The XML data structure shown in FIG. 6 is but one example of a data structure construct that can be employed in some embodiments of the present invention. Many other possible data structures, and data constructs, can be practiced while remaining within the spirit and scope of the present invention.

With respect to node N1 of schematic 400A, transformation formula [1], above, resolves to NFE 501 (see FIG. 5, and/or the equivalent code of lines 602 through 605 of XML file 600).

NFE 501: $N1 = LDR1(N2) + R2(N4) + IC1(N2N3N6N7) + D1(N9) + RLY1(N9) + 12V\text{-}IN$ Elements of NFE 501, and their meanings, are given in Table 1 below:

TABLE 1

Node function equation, NFE 501.

| Component connected to node N1 | Meaning |
|---|---|
| LDR1(N2) | Light dependent resistor LDR1 is also connected to node N2 |
| R2(N4) | Resistor R2 is also connected to node N4 |
| IC1(N2N3N6N7) | Integrated circuit IC1 is also connected to nodes N2, N3, N6, and N7 |
| D1(N9) | Diode D1 is also connected to node N9 |
| RLY1(N9) | Relay RLY1 is also connected to node N9 |
| 12 V-IN | Node N1 is connected to 12 V power |

With respect to node N5 of Schematic 400B, transformation formula [1], above, resolves to NFE 514 (see FIG. 5):

NFE 514: $N5 = LDR1(N2) + IC1(N1N2N6N7) + RLY1(N9) + D1(N9) + R2(N4) + 12V\text{-}IN$ Elements of NFE 514, and their meanings, are given in Table 2 below:

TABLE 2

Node function equation, NFE 514.

| Component connected to node N5 | Meaning |
|---|---|
| LDR1(N2) | Light dependent resistor LDR1 is also connected to node N2 |

TABLE 2-continued

Node function equation, NFE 514.

| Component connected to node N5 | Meaning |
|---|---|
| IC1(N1N2N6N7) | Integrated circuit IC1 is also connected to nodes N1, N2, N6, and N7 |
| RLY1(N9) | Relay RLY1 is also connected to node N9 |
| D1(N9) | Diode D1 is also connected to node N9 |
| R2(N4) | Resistor R2 is also connected to node N4 |
| 12 V-IN | Node N5 is connected to 12 V power |

In some embodiments of the present invention, comparison module 312 of correlation module 308 (FIG. 3) performs the following process to compare each NFE of NEL 500A, with each NFE, in turn, of NEL 500B, to detect any matches or similarities that may exist between the NELs (and by association, between the designs represented by the NELs).

Referring to FIG. 7A, comparison module 312 selects (according to any pre-defined algorithm) NFE 501 (corresponding to node N1, schematic 400A) for comparison against NFE 510 (corresponding to node N1, schematic 400B). Comparison module 312 parses the NFEs and tabulates the types of components associated with each NFE. Column 701A lists the components parsed from NFE 501. Column 701B lists the components parsed from NFE 510. Comparison module 312 arranges component types in columns 701A and 701B such that like component types (e.g. resistor, diode, etc.) are entered in common rows where possible. Column 701C lists a similarity score computed for each component type (each row). For example, there is a light dependent resistor (LDR1) in NFE 501, and no light dependent resistor in NFE 510. Comparison module 312 computes an individual similarity score associated with light dependent resistor between NFE 501 and NFE 510 as 0.00 (0/1=0.00).

Stepping down to the fixed resistor row, we see that there is one fixed resistor (R2) for NFE 501 and three resistors (R5, R1, and R4) for NFE 510. Comparison module 312 computes similarity score as 0.33 (1/3=0.33). The remaining components of NFE 501 (D1, RLY1, and 12V-IN) have no analogs in NFE 510. Consequently, the respective individual similarity scores for the remaining components are 0.00.

Once comparison module 312 has computed and tabulated the individual similarity scores for all component types of NFE 510 with respect to those of NFE 501, it computes the arithmetic mean of the individual similarity scores to arrive at a NFE 501 to NFE 510 similarity score (corresponding to node N1 of schematic 400A vs. node N1 of schematic 400B) of 0.22 ((0.33+1.00)/6=0.22).

As comparison module 312 proceeds through the entire comparison process, it stores all similarity scores, including individual NFE-based scores and the higher level NFE-based scores, and ultimately one or more top level scores indicative of the similarity between any number of designs under comparison. Some embodiments calculate the various similarity scores by different methods than illustrated above. All methods remain within the spirit and scope of the present invention.

In some embodiments, a similarity score may have multiple aspects. For example, one aspect may be a score based on the number and types of components. Another may be based on the electrical values of corresponding components, or based on how the components are wired together. Yet another aspect may be based on differences in component power ratings. To illustrate, two designs may have a high component-based similarity score if they have the same numbers and types of components, yet have: (i) a low electrical values-based similarity score if the values of corresponding components are significantly dissimilar; and/or (ii) a low connection-based score if the components are wired together in a different way.

Referring to FIG. 7B, comparison module 312 continues with NFE 501 (corresponding to node N1, schematic 400A) and selects for comparison NFE 511 (corresponding to node N2, schematic 400B). Comparison module 312 copies column 701A from FIG. 7A into column 702A of FIG. 7B. Comparison module 312 parses NFE 511 and populates column 702B with the parsed component types. Comparison module 312 arranges component types in column 702B to match up with the component types in column 702A where possible, in the same manner as was done with NFE 510 in FIG. 7A. Starting with the first row, there is a light dependent resistor for both NFE 501 and NFE 511. Comparison module 312 computes a similarity score of 1.00 (1/1=1.00). Stepping down to the fixed resistor row, there is one resistor for NFE 501 and one resistor for NFE 511. Comparison module 312 again computes a similarity score of 1.00. The next row shows both NFEs have an integrated circuit (IC1). Comparison module 312 computes a similarity score of 1.00. None of the other component types of NFE 501 (D1, RLY1, and 12V-IN) has a match with NFE 511, so comparison module 312 computes associated similarity scores of 0.00. Once comparison module 312 has computed and tabulated the individual similarity scores for all component types of NFE 511 with respect to those of NFE 501, it computes the arithmetic mean of the individual similarity scores to arrive at a NFE 501 to NFE 511 similarity score (corresponding to node N1 of schematic 400A vs. node N2 of schematic 400B) of 0.50 ((1+1+1)/6=0.50).

Referring to FIG. 7C, comparison module 312 eventually arrives at comparing NFE 501 (corresponding to node N1, schematic 400A) against NFE 514 (corresponding to node N5, schematic 400B). Comparison module 312 copies column 701A from FIG. 7A into column 705A of FIG. 7C. Comparison module 312 parses NFE 514 and populates column 705B with the parsed component types. Comparison module 312 arranges component types in column 705B to match up with the component types in column 705A where possible, in the same manner as the previous comparisons discussed above. Starting with the first row, there is a light dependent resistor for both NFE 501 and NFE 514. Comparison module 312 computes a similarity score of 1.00. Stepping down to the fixed resistor row, we see one resistor for NFE 501 and one resistor for NFE 511. Again, the similarity score is 1.00. Stepping down through all rows, comparison module 312 again computes a similarity scores of 1.00 for each row, the respective scores shown in column 705C. Comparison module 312 computes the arithmetic mean of the individual similarity scores, to arrive at a NFE 501 to NFE 514 similarity score (corresponding to node N1 of schematic 400A vs. node N5 of schematic 400B) of 1.00, or 100%, which establishes equivalence between node N1 of schematic 400A and node N5 of schematic 400B.

Through this process, comparison module 312 successively compares NFE 501 against all NFEs of NEL 500B (NFE 510 through 518) as above. It repeats the cycle, next time, successively comparing NFE 502 against all NFEs of NEL 500B, then NFE 503, etc. through NFE 509, until each NFE of NEL 500A has been compared against every NFE of NEL 500B.

As comparison module 312 proceeds through the comparison process, it stores all similarity scores, including individual NFE-based scores, the higher level NFE-based scores, and one or more top level scores indicating a final similarity score between the designs under comparison. Some embodiments determine a degree of similarity between two designs on a scale from 0% (no similarity at all) to 100% (identical).

Figure 8:
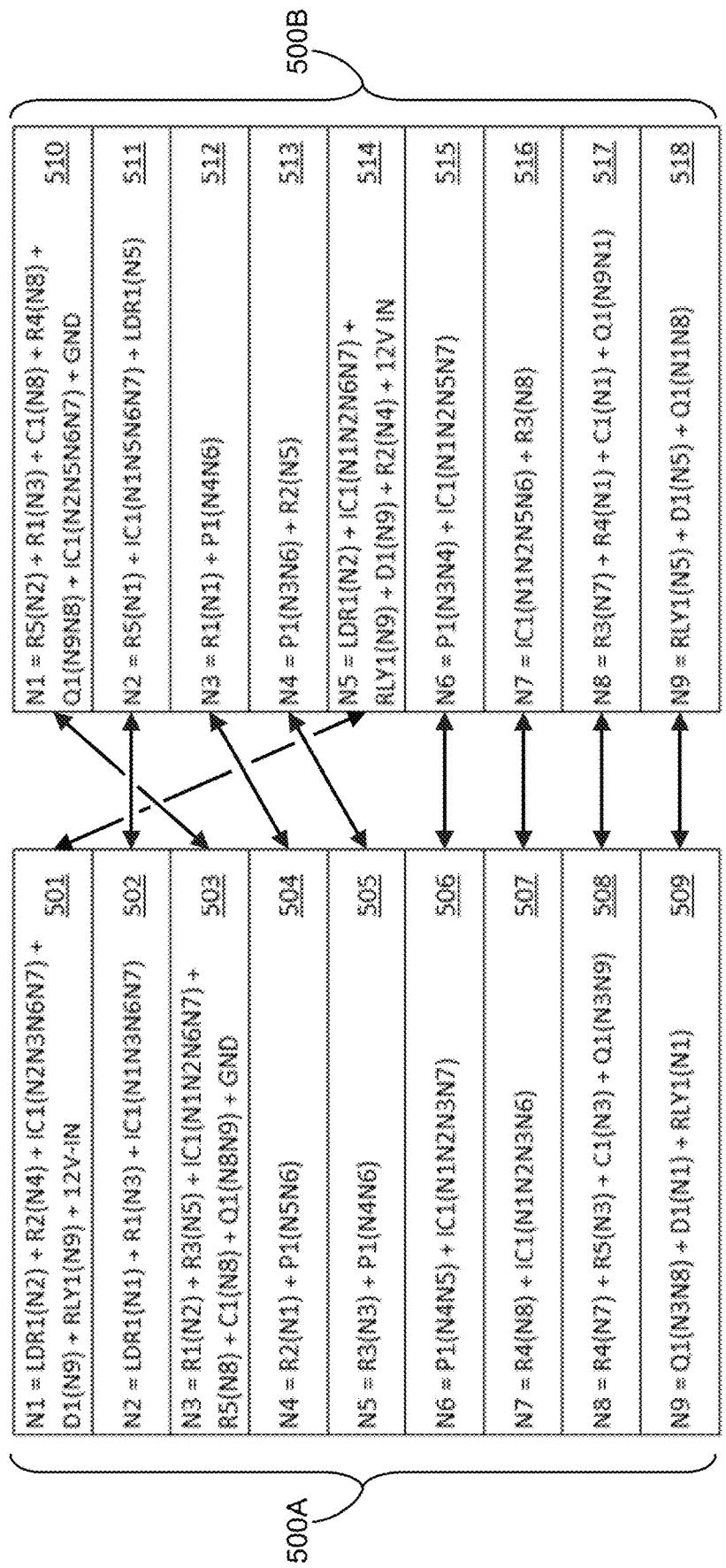
FIG. 8 is a table showing information that is generated in accordance with at least one embodiment of the present invention.

Concluding the present example, it so happens that comparison module 312 determines that schematic 400A is equivalent to schematic 400B by virtue of the fact that each NFE of NEL 500A has a match with an NFE of NEL 500B. The matches are shown by arrows in FIG. 8, and tabulated in Table 3 below:

TABLE 3

400A vs. 400B Comparison Results 1

| Schematic 400A Node | Schematic 400B Node | Similarity Score |
|---|---|---|
| N1 | N5 | 1.00 |
| N2 | N2 | 1.00 |
| N3 | N1 | 1.00 |
| N4 | N3 | 1.00 |
| N5 | N4 | 1.00 |
| N6 | N6 | 1.00 |
| N7 | N7 | 1.00 |
| N8 | N8 | 1.00 |
| N9 | N9 | 1.00 |
| Overall Similarity - 400A vs. 400B | | 100% |

Some embodiments of the present invention make use of a "similarity threshold" to help determine whether two designs being compared are considered to be similar. In some circumstances, if two designs are considered to be similar to each other, further investigation (for example, closer examination) or action (for example, altering a design, or proposing licensing terms, etc.) may be warranted. For example, if a user sets a similarity threshold at 75% and a proposed design is found to have a 50% degree of similarity with an existing design (less than the threshold), the designs may not be flagged for further investigation. If on the other hand, the two designs are found to have a 90% degree of similarity (equaling or exceeding the threshold), the two designs may be considered sufficiently similar and warrant further investigation and/or action.

In some embodiments, the similarity threshold can take on more than a single value. For example, there may be a lower threshold (for example 50%) and an upper threshold (for example 75%). A 40% degree of similarity (less than the lower threshold) warrants no further investigation. A 60% degree of similarity (equal to, or greater than the lower threshold but less than the upper threshold) may warrant further investigation (for example, a more detailed comparison between the subject designs). An 85% degree of similarity (equal to, or greater than the upper threshold) may warrant more detailed comparison analysis and/or action (triggering, for example, an infringement investigation, consideration for licensing, making a design modification, or triggering consideration for a "make-or-buy" decision, etc.).

In some embodiments, the NFEs associated with a design include configurable levels of detail about a design. For example, if a user configures a low level of detail for the abstraction phase, the resultant NFEs may include only the types of components attached at each node (such as in the examples of NEL 500A, and 500B of FIG. 5).

In some embodiments, visual recognition module 302 performs analysis in greater depth than merely to consider component types. For example, not only does visual recognition module 302 determine that 400A-R1 is connected to the same types of components as is 400B-R5, but takes into account the values and/or part numbers of respective components as well. Some embodiments also take into account the characteristics of the connections between and among the components. Connection characteristics, in some embodiments, include circuit cross sectional area, length, medium (copper conductor, optical fiber, etc.). This type of information may be significant, for example, with respect to circuit frequency, timing relationships, noise budget and/or tolerances, etc., attributes that may influence a similarity comparison result. For simplicity, this discussion considers only the component types.

In some embodiments, a user may configure generation of a node function equation with greater levels of detail to include, for example, pin designations for certain components. With respect to Table 1, above, and NFE 501 of FIG. 5, each terminal (pin) of every component connected to node N1 may be assigned an identifier (pin number, for instance) and expression NFE 501 may consequently be expanded to associate the pin numbers with the nodes to which they are connected. In one such example, NFE 501 may be expanded as follows: N1=IC1P7(N2P2 N3P4 N6P3 N7P6), where Pn indicates the component pin number that connects to the associated node. For example, the preceding expanded NFE 501 means the following: IC1 pin 7 connects to node N1 ("IC1P7"); IC1 pin 2 connects to node N2 ("N2P2"); IC1 pin 4 connects to node N3 ("N3P4"); IC1 pin 3 connects to node N6 ("N6P3"); and IC1 pin 6 connects to node N7 ("N7P6").

In some embodiments, circuit characterization program 300 characterizes each design, during the abstraction phase, with the greatest level of detail that is available in the input materials provided, after which a design comparison can be performed according to a user-selected level of detail, up to and including the level of detail at which the abstraction phase was carried out.

In some embodiments of the present invention, a node function equation may include component functional values, such as: (i) resistance; (ii) tolerance; (iii) insulation voltage rating; (iv) polarity information; (v) power rating; (vi) breakdown voltage; and/or (vii) switching speed, etc., to name just a few examples. In some embodiments, NFE generation module 310 (FIG. 3) generates an NFE with the maximum level of detail possible based on the information made available to it during the abstraction phase. A subsequent comparison phase may then be conducted with any degree of granularity, up to and including that permitted by the level of detail encoded in the relevant NFEs.

With respect to candidate "matching" components (corresponding components in two designs under comparison, which are wired in similar ways to a similar set of components), a "match" (sometimes herein referred to as a similarity score) may be defined in various ways. For example, at the component level, merely having components of the same type (resistor, capacitor, diode, etc.) may be considered to be a match, at a coarse level of granularity. At a finer level of granularity, two components of the same type may be considered to be a match only if respective values of the same types of component (for example, a resistor with a nominal resistance of 47Ω, or a capacitor with a nominal capacitance of 0.1 µF, etc.) are the same within a defined tolerance level. To illustrate, consider a node in one design where the node function equation includes a resistor specified at 47Ω nominal value, 0.5 watt rating, 5% tolerance, and of carbon film type. A resistor in an analogous node of the other design is specified at 43Ω nominal value, 0.5 watt rating, 5% tolerance, and of carbon film type. These two resistors are nearly identical, being the same in every respect except for their resistance values (47Ω vs. 43Ω). At a coarse level of granularity, the resistors may be considered a match, while at a finer level, not a match. A 47Ω±5% resister may have an actual value (with 99.7% probability assuming a Gaussian distribution with mean value at 47Ω and the 5% tolerance corresponding to ±3σ (standard deviation) limits) of 44.7Ω to 49.5Ω. Similarly, a 43Ω±5% resistor may have an actual value of 40.9Ω to 45.2Ω. The two distributions overlap in the region between 44.7Ω and 45.2Ω. Known statistical methods can be used to determine a probability that the two resistors will have the same actual value as one another. Some embodiments may influence the similarity score (or a binary decision of "match" vs. "no match") based in part on this probability.

In some embodiments of the present invention, a computer validates (compares) the functionality of a subject electronic design against the functionality of any number of existing designs. The comparison process includes the following operations: (i) receiving the NFEs representing the subject design and any number of existing designs; (ii) receiving a comparison tolerance value that indicates a desired level of refinement (sometimes herein referred to as a comparison tolerance, or a comparison threshold—the terms "level of refinement", "comparison tolerance", and "comparison threshold" are synonymous and may be used interchangeably herein) associated with the validation task; (iii) comparing the contents of the subject NFE to that of each existing NFEs, to identify all existing designs that have a degree of similarity (a comparison score, or comparison tolerance) with the subject NFE, that exceeds a defined threshold (referred to as matching design(s)); and (vii) outputting at least comparison score(s) for the matching design(s). In some embodiments, the output comprises identification of a subset of the existing designs where the comparison score equals or exceeds the comparison tolerance.

As an example, consider a designer (for example, an engineer, or a scientist) working at an establishment, who wants to determine if a competitor, or another user, has used a design, owned by the establishment, without having obtained a license and/or paid corresponding royalties. The designer uses an embodiment of the present invention to compare any designs owned by the establishment, against designs stored in a schematics archive database (SADB, discussed two paragraphs below), which has been populated with any number of schematic designs and gathered from a wide assortment of publicly available information. Embodiments then flag, for further attention, any design(s) in the SADB which are identified to have at least a threshold degree of similarity to one or more designs owned by the enterprise.

In some embodiments, a user may set certain configuration parameters. The visual recognition system and/or an application programming interface (API), in a learning phase, searches through a corpus of information pertaining to components used in electronic designs, standard symbology, etc., so that it can later recognize those components in full schematics through, for example, image processing techniques. The corpus of information includes (without limitation) manufacturer catalogs, textbooks, online sources of electronics information, to name a few examples. The information includes (without limitation) graphical symbols with which certain components are represented, and associated operating characteristics (electrical and/or optical characteristics and operating parameters, for instance), for all manner of electrical, electronic, and electro-optical components, both passive and active. In some embodiments, the learning phase continues indefinitely, before and after the system is in productive operation, to stay abreast of any new information that may become available for existing or newly developed components.

In some embodiments of the present invention, operators and/or automated systems provide, to a visual recognition service, schematics for processing. Some embodiments create a "schematics archive database" (SADB) beginning with a learning phase, and continuing indefinitely any time additional schematics are made available for processing. Sources of the schematic designs may be influenced by the user's goals. For example, an enterprise developing a new circuit design may seek to find any patents against which the new design might infringe. In this type of case, the SADB may be populated with all active relevant patents on record. On the other hand, if the enterprise holds a patent on a circuit design, a goal may be to find any products on the market which may infringe the patent. In such a case, the schematics archive database may be populated with any available product design information gathered from any source, such as product literature, scientific or technical papers, or other materials pertaining to certain products, etc.

Some embodiments of the present invention perform a 2-phase comparison process. Once a subject NEL is available for comparison, the system starts phase-one of the comparison process. In phase-one, the numbers, and respective types, of different elements in the subject NEL are compared against the numbers, and respective types, of different elements in each of the existing NEL(s) against which the subject NEL is being compared. The existing NEL(s) may be stored in an SADB, or they may be provided by, or obtained from, any available source.

If the comparison result between the subject NEL and an existing NEL exceeds a configured similarity threshold (a match is identified), then some embodiments flag the "matching" existing NEL(s). Once matching NEL(s) are flagged, embodiments enter phase-two of the comparison process. In phase-two, the system performs a more detailed comparison. In some embodiments, a phase-two comparison includes comparing the obtained individual nets contained in the subject NEL against the individual nets in each of the identified "matching" existing NEL(s). The similarity thresholds for phase-one and phase two comparisons may be the same or different as one another.

In some embodiments of the present invention, a user submits a subject schematic image to the system and configures a desired level of search refinement (sometimes herein referred to as a comparison tolerance, or similarity threshold). The system employs visual recognition algorithms to convert the schematic image into machine readable tables of a suitable format, such as node equations list (for example, NEL500A), comprising a set of node function equations (for example, NFE 501-NFE 509) (see FIG. 5).

The system identifies nodes in the subject schematic and generates a new "node equations list" (NEL), comprising a plurality of "node function equations" (NFEs). The system, based on the configured level of refinement, compares the plurality of NFEs in the subject NEL against NFEs in known NELs stored in a schematics archive database (SADB). The system displays the comparison results.

Some embodiments collect and maintain a library of many different electronic designs (for example, designs gleaned from patent records, or other published sources) in a repository called a "schematics archive database" (SADB). Some embodiments enable a designer, who has developed a tentative electronic circuit design or device, to determine if the design might appear to infringe a valid patent or other intellectual property, by comparing the tentative design against designs represented in the SADB or elsewhere.

An example use case scenario will now be presented. Consider a user who has a subject electronic design (represented by a schematic diagram) and wants to know if there is a similar design among designs represented in a schematics archive database (SADB). The user submits the subject design to the system. The system prompts the user to select a granularity of the search level. In this example, the user configures a search refinement level (also herein referred to as a similarity threshold) of 70 percent. In response, the system will show only similarity results equal to, or greater than 70 percent.

Based on the subject schematic diagram, the system generates a new node equations list (NEL), comprising a set of node function equations (NFEs). The system compares the NFEs of the subject design against the NFEs (corresponding to existing designs) stored within the schematics archive database (SADB) to identify similarities between the subject design and each of the existing designs represented in the SADB.

Once provided with (or having generated) NELs corresponding to two designs under comparison, the system determines a similarity between the designs as follows. The system iterates through each node of one design and determines if there is an analogous node in the other design (meaning that the pair of analogous nodes have a similar NFEs). Once analogous pairs of nodes have been identified, the system determines a similarity level between the respective NFEs of each pair. The similarity level between two NFEs is determined when components connected to a node in one of the designs (represented by the respective NFE) match the components connected to a node in the other design. The system proceeds to determine: (i) a degree of similarity between each pair of analogous NFEs; and (ii) aggregates all the degrees of similarity (respectively corresponding to all the nodes in the designs) to determine an overall degree of similarity between the two designs. The manner of aggregation varies. In one embodiment, the NFE similarity levels are averaged together. In another embodiment, the overall similarity level between the design is a root-mean-square of the NFE similarity levels. The foregoing examples of aggregation methods are but two examples of many possible methods.

Continuing with the present example use case scenario, the system determines that one design existing in the SADB has an 85% similarity with the subject design. Since this exceeds the 70% similarity threshold, the system identifies the existing design as being a match with the subject design. The matching existing design is displayed to the user. In some embodiments, based on user input, the system generates a production order, a purchase order, or a warehouse pick order, or any other order that results in delivery, to the user, of a working physical example of the matching existing design which can then be analyzed in a test lab for functional comparison with the subject design.

In some embodiments, a data structure for a single design is sequentially compared against data structures respectively corresponding to a selected plurality of members of a schematics archive database. Members of the schematics archive database that are selected for comparison against the single design are selected based, at least in part, on a total number of different types of components in the single design and each member of the schematics archive database.

In some embodiments, the system interfaces with an enterprise purchasing system, or other database system, from which it extracts supplier and cost information (if available) for each component represented in the new schematic. Based on the extracted supplier and cost information and the new schematic, the system generates a customizable list (for example, a bill of material) to provide business management information with respect to the design represented by the new schematic. In some embodiments, the system stores bill of material information in the schematic archive data base.

In some embodiments, the system generates respective production and/or procurement costs of both the new design and similar design(s). These costs may be based on the user's existing supplier business relationships, supplier catalog information, and/or in-house production costing information.

IV. Definitions

Node: any signal path (whether it be an electrical conductor, an optical fiber or light guide, or any type of wired or wireless signal path, etc.) that operationally couples two or more circuit components electrically, optically, inductively, capacitively, magnetically, operationally, and/or wirelessly (for example via radio frequency transmission, or acoustically), or by any other means, singly or in combination, capable of conducting a signal from one component to another.

Signal path: (i) electrical connections, electrical circuit lines, busses, and/or electrically conductive mechanical connections; (ii) optical connections via optical fibers, light-guides, or free space; (iii) wireless connections such as radio frequency, microwaves, or any other region of the electromagnetic spectrum; (iv) inductive, or capacitive coupling; (v) acoustic coupling (including signal propagation via air, liquid and/or solid conduction media,); (vi) quantum coupling; and/or (vii) any technique, now known or to be developed in the future, for the transmission of signals, power, and/or information from one component to another.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

User/subscriber: includes, but is not necessarily limited to, the following: (i) a single individual human; (ii) an artificial intelligence entity with sufficient intelligence to act as a user or subscriber; and/or (iii) a group of related users or subscribers.

Electrically Connected: means either directly electrically connected, or indirectly electrically connected, such that intervening elements are present; an electrical connection may include, but need not be limited to, elements such as capacitors, inductors, transformers, vacuum tubes, and the like.

Receive/provide/send/input/output/report: unless otherwise explicitly specified, these words should not be taken to imply: (i) any particular degree of directness with respect to the relationship between their objects and subjects; and/or (ii) absence of intermediate components, actions and/or things interposed between their objects and subjects.

Without substantial human intervention: a process that occurs automatically (often by operation of machine logic, such as software) with little or no human input; some examples that involve "no substantial human intervention" include: (i) computer is performing complex processing and a human switches the computer to an alternative power supply due to an outage of grid power so that processing continues uninterrupted; (ii) computer is about to perform resource intensive processing, and human confirms that the resource-intensive processing should indeed be undertaken (in this case, the process of confirmation, considered in isolation, is with substantial human intervention, but the resource intensive processing does not include any substantial human intervention, notwithstanding the simple yes-no style confirmation required to be made by a human); and (iii) using machine logic, a computer has made a weighty decision (for example, a decision to ground all airplanes in anticipation of bad weather), but, before implementing the weighty decision the computer must obtain simple yes-no style confirmation from a human source.

Automatically: without any human intervention.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, and/or application-specific integrated circuit (ASIC) based devices.

What is claimed is:

1. A computer-implemented method comprising:
    receiving design information corresponding to a first device;
    identifying, via a neural network, and based on standard electronic design symbology, a first component of the first device, and a first node of the first device;
    generating a first data structure based on the design information for the first device, wherein the first data structure includes a first element corresponding to a combination of the first component and the first node;
    receiving, from a database, a second data structure corresponding to a second device, wherein the second data structure includes a second element corresponding to a combination of a second component of the second device and a second node of the second device;
    comparing the first component against the second component to generate a comparison dataset comprising a numerical degree of similarity, with respect to an electrical characteristic, between the first component and the second component, wherein the numerical degree of similarity takes into account a probability of value overlap of electrical characteristics respectively corresponding to the first component and the second component, wherein the first component and the second component have different nominal values;
    sending the comparison dataset to a storage address; and
    sending the first data structure to the database.

2. The method of claim 1, wherein generating the first data structure comprises:
    determining a first type of the first component of the first device;
    determining a second type of the second component of the first device; and
    determining that the first component and the second component are operationally coupled.

3. The method of claim 1, wherein:
    design information for the first device is selected from the group consisting of: a schematic diagram; an open American Standard Code for Information Interchange (ASCII) vector format for two-dimensional (2D) binary image file; component placement data; drill data; printed circuit board mask data; printed circuit board layup information; test data; circuit logic response data; circuit analog response data; and netlist data.

4. The method of claim 3; wherein generating the first data st re comprises:
    applying a transformation formula to the first schematic diagram.

5. The method of claim 4, wherein the transformation formula is formatted as a sum of products.

6. The method of claim 5, wherein the transformation formula is $N_{f(N)}=C_{x1}(N_{y1})+C_{x2}(N_{y2})+ \ldots +C_{xn}(N_{yn})$;
    wherein: $N_{f(N)}$ represents a given node, $C_{xn}$ represents a component connected to the given node, and $N_{yn}$ represents another node connected to component $C_{xn}$.

7. A computer program product comprising a computer readable storage medium having stored thereon program instructions programmed to perform:
    receiving design information corresponding to a first device;
    identifying, via a neural network; and based on standard electronic design symbology; a first component of the first device, and a first node of the first device;
    generating a first data structure based on the design information for the first device, wherein the first data structure includes a first element corresponding to a combination of the first component and the first node;
    receiving, from a database, a second data structure corresponding to a second device, wherein the second data structure includes a second element corresponding to a combination of a second component of the second device and a second node of the second device;
    comparing the first component against the second component to generate a comparison dataset comprising a numerical degree of similarity, with respect to an electrical characteristic, between the first component and the second component, wherein the numerical degree of similarity takes into account a probability of value overlap of electrical characteristics respectively corresponding to the first component and the second component, wherein the first component and the second component have different nominal values;
    sending the comparison dataset to a storage address; and
    sending the first data structure to the database.

8. The computer program product of claim 7, wherein generating the first data structure comprises:
    determining a first type of the first component of the first device;

determining a second type of the second component of the first device; and determining that the first component and the second component are operationally coupled.

9. The computer program product of claim 7, wherein: design information for the first device is selected from the group consisting of: a schematic diagram; an open American Standard Code for Information Interchange (ASCII) vector format for two-dimensional (2D) binary image file; component placement data; drill data; printed circuit board mask data; printed circuit board layup information; test data; circuit logic response data; circuit analog response data; and netlist data.

10. The computer program product of claim 9, wherein generating the first data structure comprises:

applying a transformation formula to the first schematic diagram.

11. The computer program product of claim 10, wherein the transformation formula is formatted as a sum of products.

12. The computer program product of claim 11; wherein the transformation formula is $N_{f(N)}=C_{x1}(N_{y1})=C_{x2}(N_{y2})+ \ldots +C_{xn}(N_{yn})$;

wherein: $N_{f(N)}$ represents a given node, $C_{xn}$ represents a component connected to the given node, and $N_{yn}$ represents another node connected to component $C_{xn}$.

13. A computer system comprising:

a processor set; and a computer readable storage medium;

wherein the processor set is structured; located, connected and/or programmed to run program instructions stored on the computer readable storage medium; and the program instructions include instructions programmed to perform:

receiving design information corresponding to a first device;

identifying, via a neural network, and based on standard electronic design symbology, a first component of the first device; and a first node of the first device;

generating a first data structure based on the design information for the first device, wherein the first data structure includes a first element corresponding to a combination of the first component and the first node;

receiving, from a database, a second data structure corresponding to a second device, wherein the second data structure includes a second element corresponding to a combination of a second component of the second device and a second node of the second device;

comparing the first component against the second component to generate a comparison dataset comprising a numerical degree of similarity, with respect to an electrical characteristic, between the first component and the second component, wherein the numerical degree of similarity takes into account a probability of value overlap of electrical characteristics respectively corresponding to the first component and the second component, wherein the first component and the second component have different nominal values;

sending the comparison dataset to a storage address; and sending the first data structure to the database.

14. The computer system of claim 13, wherein generating the first data structure comprises:

determining a first type of the first component of the first device;

determining a second type of the second component of the first device; and determining that the first component and the second component are operationally, coupled.

15. The computer system of claim 13, wherein:

design information for the first device is selected from the group consisting of: a schematic diagram; an open American Standard Code for Information interchange (ASCII) vector format for two-dimensional (2D) binary image file; component placement data; drill data; printed circuit board mask data; printed circuit board layup information; test data; circuit logic response data; circuit analog response data; and netlist data.

16. The computer system of claim 15, wherein generating the first data structure comprises:

applying a transformation formula to the first schematic diagram.

17. The computer system of claim 16, wherein the transformation formula is formatted as a sum of products.

18. The computer system of claim 17, wherein the transformation formula is $N_{f(N)}=C_{x1}(N_{y1})+C_{x2}(N_{y2})+ \ldots +C_{xn}(N_{yn})$;

wherein: $N_{f(N)}$ represents a given node, $C_{xn}$ represents a component connected to the given node, and $N_{yn}$ represents another node connected to component $C_{xn}$.

* * * * *